(12) United States Patent
Konyuba

(10) Patent No.: US 12,688,611 B2
(45) Date of Patent: Jul. 21, 2026

(54) ELECTRON MICROSCOPE AND CALIBRATION METHOD

(71) Applicant: JEOL Ltd., Tokyo (JP)

(72) Inventor: Yuji Konyuba, Tokyo (JP)

(73) Assignee: JEOL Ltd., Tokyo (JP)

( * ) Notice: Subject to any disclaimer, the term of this patent is extended or adjusted under 35 U.S.C. 154(b) by 86 days.

(21) Appl. No.: 18/805,668

(22) Filed: Aug. 15, 2024

(65) Prior Publication Data

US 2025/0061606 A1 Feb. 20, 2025

(30) Foreign Application Priority Data

Aug. 17, 2023 (JP) ................................. 2023-132919

(51) Int. Cl.
G06T 7/80 (2017.01)
H01J 37/26 (2006.01)
(52) U.S. Cl.
CPC ................ G06T 7/80 (2017.01); H01J 37/26 (2013.01)
(58) Field of Classification Search
CPC .. H01J 37/26; H01J 37/22; H01J 37/28; H01J 37/153; G06T 7/80; G01N 23/225
See application file for complete search history.

(56) References Cited

U.S. PATENT DOCUMENTS

2019/0140002 A1 5/2019 Sakaguchi et al.

FOREIGN PATENT DOCUMENTS

JP 2011003336 A * 1/2011 .............. H01J 37/22
JP 20222317 A 1/2022

* cited by examiner

*Primary Examiner* — Georgia Y Epps
*Assistant Examiner* — Don J Williams
(74) *Attorney, Agent, or Firm* — The Webb Law Firm

(57) ABSTRACT

An electron microscope includes an electron optical system that irradiates a sample with an electron beam to form an image with electrons transmitted through the sample, a camera that includes an image sensor having sensor pixels and captures frame images that are based on output values output from each of the sensor pixels by incidence of the electrons on the image sensor, and a correction coefficient calculation unit that calculates correction coefficients for correcting sensitivities of the sensor pixels. The correction coefficient calculation unit determines, from the frame images captured under a condition under which the electrons incident on the image sensor follow a Poisson process, a mode value of the output values for each of the sensor pixels, and calculates the correction coefficients based on the mode value determined for each of the sensor pixels.

7 Claims, 10 Drawing Sheets

2a        2

| 38 | 58 | 72 | 12 | 1662 |
|---|---|---|---|---|
| 65 | 160 | 652 | 32 | 50 |
| 38 | 50 | 584 | 72 | 1802 |
| 2706 | 68 | 40 | 726 | 46 |
| 82 | 22 | 42 | 46 | 58 |

4a        4

| 10 | 10 | 2 | 2 | 12 |
|---|---|---|---|---|
| 10 | 10 | 2 | 2 | 10 |
| 8 | 8 | 4 | 2 | 2 |
| 6 | 6 | 2 | 6 | 4 |
| 2 | 2 | 2 | 6 | 8 |

2a        2A

| 28 | 48 | 70 | 10 | 1650 |
|---|---|---|---|---|
| 55 | 150 | 650 | 30 | 40 |
| 30 | 42 | 580 | 70 | 1800 |
| 2700 | 62 | 38 | 720 | 42 |
| 80 | 20 | 40 | 40 | 50 |

2a    2A

| 28 | 48 | 70 | 10 | 1650 |
|----|----|----|----|------|
| 55 | 150 | 650 | 30 | 40 |
| 30 | 42 | 580 | 70 | 1800 |
| 2700 | 62 | 38 | 720 | 42 |
| 80 | 20 | 40 | 40 | 50 |

÷

6a    6

| 1.088 | 0.973 | 0.982 | 1.025 | 1.060 |
|-------|-------|-------|-------|-------|
| 1.079 | 0.958 | 1.032 | 0.959 | 0.948 |
| 0.918 | 0.958 | 0.998 | 0.922 | 1.043 |
| 1.070 | 0.951 | 1.084 | 0.968 | 0.999 |
| 0.985 | 1.027 | 1.055 | 0.975 | 0.942 |

2a    2B

| 26 | 49 | 71 | 10 | 1557 |
|----|----|----|----|------|
| 51 | 157 | 630 | 31 | 42 |
| 33 | 44 | 581 | 76 | 1726 |
| 2523 | 65 | 35 | 744 | 42 |
| 81 | 19 | 38 | 41 | 53 |

| 951 | 850 | 858 | 896 | 926 |
|---|---|---|---|---|
| 943 | 837 | 902 | 838 | 828 |
| 802 | 837 | 872 | 806 | 911 |
| 935 | 831 | 947 | 846 | 873 |
| 861 | 897 | 922 | 852 | 823 |

ELECTRON MICROSCOPE AND CALIBRATION METHOD

CROSS-REFERENCE TO RELATED APPLICATION

This application claims priority to Japanese Patent Application No. 2023-132919, filed Aug. 17, 2023, the disclosure of which is hereby incorporated by reference in its entirety.

BACKGROUND OF THE INVENTION

Field of the Invention

The present invention relates to an electron microscope and a calibration method.

Description of Related Art

As a camera for a transmission electron microscope, a direct detection camera is known in which electrons are directly incident on a sensitive area of an image sensor. For example, JP-A-2022-002317 discloses, as a camera for a transmission electron microscope, a direct detection camera including a direct detector (image sensor). In the direct detector disclosed in JP-A-2022-002317, a semiconductor layer that detects an electron beam is thinned to control interaction between the electron beam and the semiconductor layer. Thus, it is possible to reduce noise due to excessive signal of not less than incident electrons which is caused by the interaction between the electron beam and the semiconductor layer.

The direct detector disclosed in JP-A-2022-002317 includes a plurality of pixels for forming an image based on the electron beam. In an image sensor including such a plurality of pixels, due to a manufacturing error or the like, a sensitivity may differ from one pixel to another. Therefore, an electron microscope capable of correcting a sensitivity differing from one pixel to another is desired.

SUMMARY OF THE INVENTION

According to a first aspect of the present disclosure, there is provided an electron microscope including:

an electron optical system that irradiates a sample with an electron beam to form an image with electrons transmitted through the sample;

a camera that includes an image sensor having sensor pixels and captures frame images that are based on output values output from each of the sensor pixels by incidence of the electrons on the image sensor; and a correction coefficient calculation unit that calculates correction coefficients for correcting sensitivities of the sensor pixels, the correction coefficient calculation unit determining, from the frame images captured under a condition under which the electrons incident on the image sensor follow a Poisson process, a mode value of the output values for each of the sensor pixels, and the correction coefficient calculation unit calculating the correction coefficients based on the mode value determined for each of the sensor pixels.

According to a second aspect of the present disclosure, there is provided a calibration method for an image sensor in an electron microscope including an electron optical system that irradiates a sample with an electron beam to form an image with electrons transmitted through the sample, and a camera that includes the image sensor having sensor pixels and captures frame images that are based on output values output from each of the sensor pixels by incidence of the electrons on the image sensor, the calibration method including:

determining, from the frame images captured under a condition under which the electrons incident on the image sensor follow a Poisson process, a mode value of the output values for each of the sensor pixels; and calculating correction coefficients for correcting sensitivities of the sensor pixels based on the mode value determined for each of the sensor pixels.

DESCRIPTION OF THE INVENTION

According to an embodiment of the present disclosure, there is provided an electron microscope including:

an electron optical system that irradiates a sample with an electron beam to form an image with electrons transmitted through the sample;

a camera that includes an image sensor having sensor pixels and captures frame images that are based on output values output from each of the sensor pixels by incidence of the electrons on the image sensor; and a correction coefficient calculation unit that calculates correction coefficients for correcting sensitivities of the sensor pixels, the correction coefficient calculation unit determining, from the frame images captured under a condition under which the electrons incident on the image sensor follow a Poisson process, a mode value of the output values for each of the sensor pixels, and the correction coefficient calculation unit calculating the correction coefficients based on the mode value determined for each of the sensor pixels.

In such an electron microscope, it is possible to correct mutually different sensitivities of the sensor pixels.

According to an embodiment of the present disclosure, there is provided a calibration method for an image sensor in an electron microscope including an electron optical system that irradiates a sample with an electron beam to form an image with electrons transmitted through the sample, and a camera that includes the image sensor having sensor pixels and captures frame images that are based on output values output from each of the sensor pixels by incidence of the electrons on the image sensor, the calibration method including:

determining, from the frame images captured under a condition under which the electrons incident on the image sensor follow a Poisson process, a mode value of the output values for each of the sensor pixels; and calculating correction coefficients for correcting sensitivities of the sensor pixels based on the mode value determined for each of the sensor pixels.

In such a calibration method, it is possible to correct mutually different sensitivities of the sensor pixels.

Now preferred embodiments of the present invention will be described in detail with reference to the drawings. The embodiments described below are not intended to unduly limit the contents of the present invention described in the claims. Further, all of the components described below are not necessarily essential requirements of the present invention.

1. ELECTRON MICROSCOPE

Figure 1:
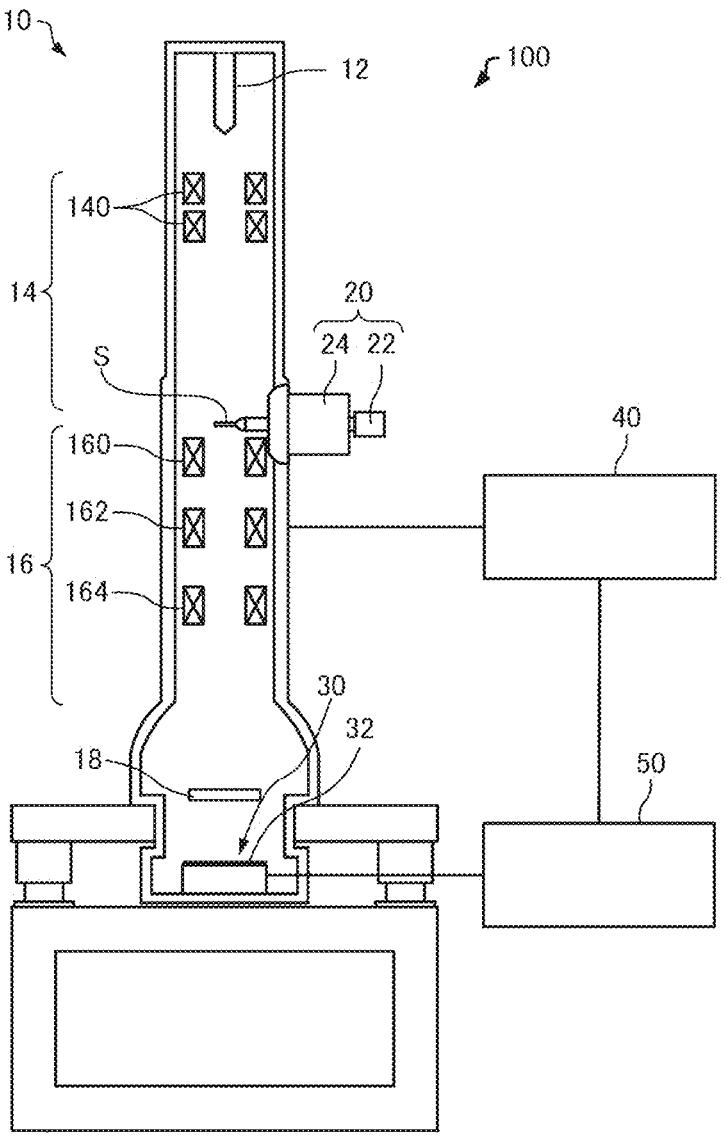
FIG. 1 is a diagram illustrating a configuration of an electron microscope according to an embodiment of the present invention.

First, referring to the drawings, a description will be given of an electron microscope according to an embodiment of the present invention. FIG. 1 is a diagram illustrating a configuration of an electron microscope 100 according to the embodiment of the present invention.

The electron microscope 100 includes an electron optical system 10, a sample stage 20, a camera 30, an electron optical system control unit 40, and an imaging processing device 50.

The electron optical system 10 irradiates a sample S with an electron beam to form an image with electrons transmitted through the sample S. The electron optical system 10 includes an electron source 12, an irradiation system 14, an image formation system 16, and a fluorescent screen 18 functioning also as a shutter for the electron beam.

The electron source 12 emits the electron beam. For example, the electron source 12 is an electron gun that accelerates the electrons emitted from a negative electrode with a positive electrode to emit the electron beam.

The irradiation system 14 irradiates the sample S with the electron beam emitted from the electron source 12. For example, the irradiation system 14 irradiates the sample S with parallel beams. The irradiation system 14 includes a plurality of condenser lenses 140. The condenser lenses 140 focus the electron beam emitted from the electron source 12. The irradiation system 14 may also include a lens other than the condenser lenses 140, a diaphragm, or the like, though not illustrated.

The image formation system 16 is an optical system for forming an image with the electron beam transmitted through the sample S. The image formation system 16 includes an objective lens 160, an intermediate lens 162, and a projector lens 164.

The objective lens 160 is a first-stage lens for forming a TEM image (sample image) with the electron beam transmitted through the sample S. On a rear focal plane of the objective lens 160, an electron diffraction pattern is formed. The intermediate lens 162 changes a focal length to focus on the TEM image or the electron diffraction pattern formed by the objective lens 160. Thus, it is possible to enlarge the TEM image or the electron diffraction pattern and form the TEM image or the electron diffraction pattern on an object plane of the projector lens 164. The projector lens 164 enlarges the image (the TEM image or the electron diffraction pattern) formed by the intermediate lens 162 to form an image on the fluorescent screen 18 or on the camera 30.

The image formation system 16 may also include a lens other than the objective lens 160, the intermediate lens 162, and the projector lens 164, a diaphragm, or the like.

The fluorescent screen 18 visualizes the TEM image and the electron diffraction pattern. At the fluorescent screen 18, a fluorescent material is excited by collision of the electrons, and emitted visible light creates light and dark corresponding to intensities of the electrons. The fluorescent screen 18 is arranged on a stage previous to the camera 30. The fluorescent screen 18 serves also as the shutter for the electron beam. For example, in a state where the fluorescent screen 18 closes a camera chamber in which the camera 30 is placed, the electron beam is not incident on the camera 30. In a state where the fluorescent screen 18 is flipped up to open the camera chamber, the electron beam is incident on the camera 30 to allow the camera 30 to capture the TEM image and the electron diffraction pattern.

The sample stage 20 holds the sample S. The sample stage 20 can tilt the sample S. The sample stage 20 includes a sample holder 22 and a goniometer 24. The sample holder 22 holds the sample S. The sample holder 22 is inserted in the goniometer 24. The goniometer 24 can tilt or move the sample S.

The camera 30 includes an image sensor 32 having a plurality of sensor pixels. The camera 30 is a direct detection camera that directly detects the electron with the image sensor 32. Examples of the direct detection camera include K2 (manufactured by Gatan Co., Ltd.), K3 (manufactured by Gatan Co., Ltd.), Falcon 4 (manufactured by Thermo Fisher Science Co., Ltd.), DE-64 (manufactured by Direct Electron Co., Ltd.), and the like.

As a camera for an electron microscope, each of an indirect detection camera and a direct detection camera is known. The indirect detection camera converts electrons to light with a scintillator and detects the light with an image sensor. Meanwhile, the direct detection camera directly detects the electrons with the image sensor 32 without using a scintillator. The direct detection camera can reduce bokeh resulting from spreading of light in a process of converting the electrons to the light with the scintillator, and therefore a high-definition image can be acquired. In addition, the direct detection camera allows a high contrast to be obtained with low irradiance. Accordingly, the electron microscope 100 including the direct detection camera is appropriate as a cryo-electron microscope which observes a biological sample in a frozen state or the like.

The camera 30 captures a frame image. The frame image has a plurality of image pixels corresponding on a one-to-one basis to the plurality of sensor pixels of the image sensor 32, and the plurality of image pixels have respective pixel values according to output values of the corresponding sensor pixels. The output values of the sensor pixels correspond to an amount of signal (an amount of charge) generated by the electrons incident on the sensor pixels.

Note that the plurality of sensor pixels of the image sensor 32 may also be collectively regarded as one sensor pixel. In other words, the image pixels may also have the pixels values according to the output values of the plurality of sensor pixels regarded as the one sensor pixel.

The camera 30 captures the TEM image or the electron diffraction pattern formed by the image sensor 32 and outputs the captured image as a frame image. A frame is a minimum image capturing unit, and the frame image is an image obtained by capturing one frame. For example, the camera 30 is capable of capturing 400 frames per second. In other words, the camera 30 is capable of capturing 400 frame images per second. The electron microscope 100 integrates the frame images corresponding to several hundreds to several thousands of frames to generate one image (the TEM image or the image of the electron diffraction pattern).

Examples of the image sensor 32 include a CMOS (Complementary Metal-Oxide-Semiconductor) image sensor, a CCD (Charge Coupled Device) image sensor, and the like. By using the CMOS image sensor as the image sensor 32, it is possible to capture the frame images at a frame rate higher than that when the CCD image sensor is used. In other words, by using the CMOS image sensor as the image sensor 32, it is possible to increase the number of the frame images that can be captured in a unit time.

The electron optical system control unit 40 controls the electron optical system 10. By controlling the electron optical system 10 with the electron optical system control unit 40, it is possible to form the TEM image or the image of the electron diffraction pattern. For example, the electron optical system control unit 40 includes a processing circuit such as a CPU (Central Processing Unit) or a FPGA (Field Programmable Gate Array) and a memory circuit such as a semiconductor memory. The electron optical system control unit 40 performs various control processing by causing the processing circuit such as the CPU to execute a program stored in the memory circuit.

The imaging processing device 50 performs processing such as processing of controlling the camera 30, image processing with respect to the frame images, calibration processing with respect to the image sensor 32, and processing of acquiring a dark-time image.

Figure 2:
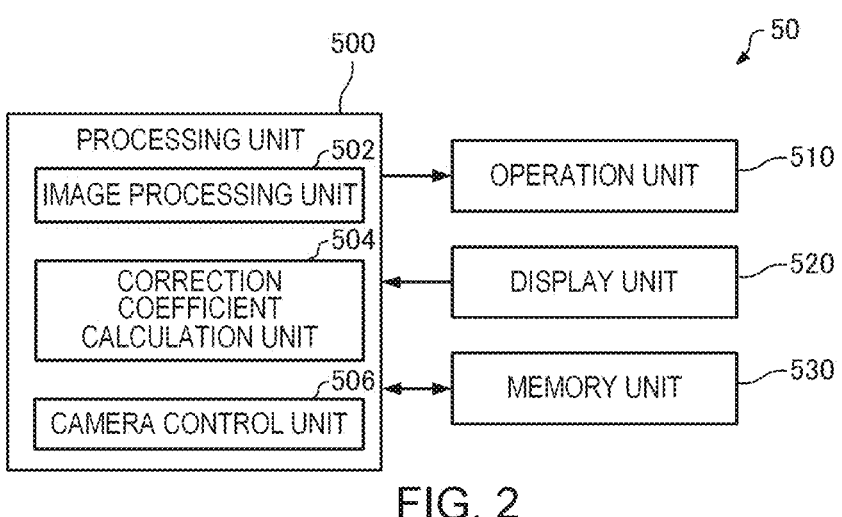
FIG. 2 is a diagram illustrating an example of a configuration of an imaging processing device.

FIG. 2 is a diagram illustrating an example of a configuration of the imaging processing device 50.

As illustrated in FIG. 2, the imaging processing device 50 includes a processing unit 500, an operation unit 510, a display unit 520, and a memory unit 530.

The operation unit 510 is for a user to input operation information, and outputs the input operation information to the processing unit 500. A function of the operation unit 510 can be implemented by an input device such as a keyboard, a mouse, a button, a touch panel, or a touch pad.

The display unit 520 displays an image generated by the processing unit 500. A function of the display unit 520 can be implemented by an LCD (Liquid Crystal Display), a touch-panel-type display, or the like.

The memory unit 530 stores programs, data, and the like for the processing unit 500 to perform various calculation processing and control processing. In addition, the memory unit 530 is used as a work area for the processing unit 500, and is used also to temporarily store results of calculation performed by the processing unit 500 according to the various programs. A function of the memory unit 530 can be implemented by a RAM (Random Access Memory), a ROM (Read Only Memory), a hard disk, or the like.

The processing unit 500 performs processing such as the processing of controlling the camera 30, the image processing with respect to the frame images, the calibration processing with respect to the image sensor 32, and the processing of acquiring the dark-time image. A function of the processing unit 500 can be implemented by any of various processors such as a CPU (Central Processing Unit), a GPU (Graphics Processing Unit), and a DSP (Digital Signal Processor) by executing the program stored in the memory unit 530. The processing unit 500 includes an image processing unit 502, a correction coefficient calculation unit 504, and a camera control unit 506.

The image processing unit 502 generates one image from the plurality of frame images captured by the camera 30. As the image, the TEM image or the image of the electron diffraction pattern is generated herein. The image processing unit 502 performs dark image subtraction processing, sensitivity correction processing of correcting a sensitivity of each of the sensor pixels of the image sensor 32, counting processing, and integration processing to generate the image. Details of each processing will be described later.

The correction coefficient calculation unit 504 calculates a plurality of correction coefficients for correcting the sensitivities of the plurality of sensor pixels included in the image sensor 32. In the sensitivity correction processing, the image processing unit 502 uses the plurality of correction coefficients calculated by the correction coefficient calculation unit 504 to correct the sensitivities of the plurality of sensor pixels of the image sensor 32.

The camera control unit 506 controls the camera 30. For example, the camera control unit 506 performs processing of acquiring the dark-time image to be used in the dark image subtraction processing. The dark-time image is an image captured in a state where the electron beam is not incident on the camera 30. The camera control unit 506 acquires the control information for the electron optical system 10 from the electron optical system control unit 40 and controls the camera 30 based on the acquired control information to acquire the dark-time image. For example, the camera control unit 506 determines whether or not the electron beam is incident on the camera 30 based on the control information for the electron optical system 10 and controls the camera 30 to acquire the dark-time image when having determined that the electron beam is not incident on the camera 30.

2. PROCESSING BY IMAGE PROCESSING UNIT

Figure 3:
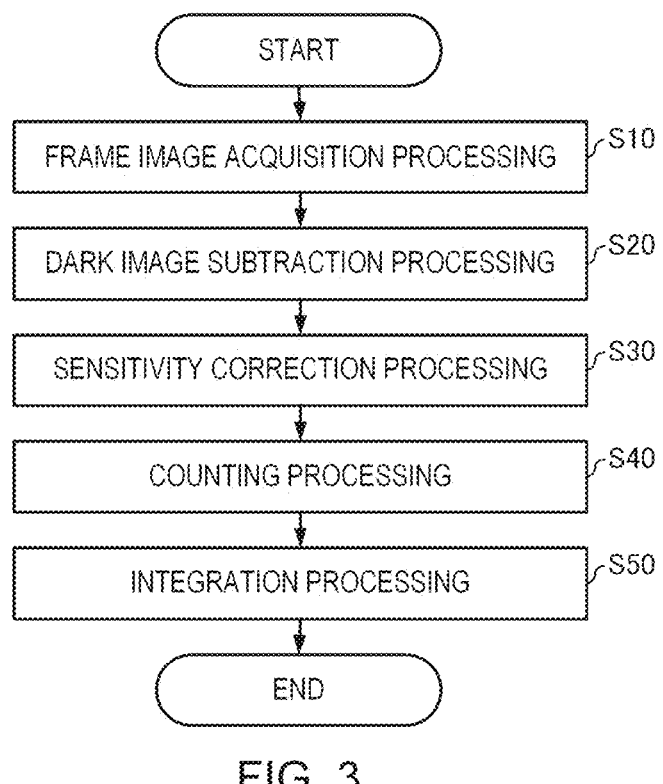
FIG. 3 is a flow chart illustrating an example of a flow of image generation processing in an imaging processing unit.

FIG. 3 is a flow chart illustrating an example of a flow of image generation processing by the image processing unit 502.

The image processing unit 502 generates one image from the plurality of frame images captured by the camera 30. As illustrated in FIG. 3, the image processing unit 502 performs frame image acquisition processing S10, dark image subtraction processing S20, sensitivity correction processing S30, counting processing S40, and integration processing S50. Thus, the one image can be generated from the plurality of frame images. The following will describe a case where the image is generated by capturing the TEM image with the camera 30.

(1) Frame Image Acquisition Processing S10

In the electron optical system 10, the irradiation system 14 irradiates the sample S with the electron beam, and the image formation system 16 forms the TEM image with the electrons transmitted through the sample S on the image sensor 32. In this state, the camera control unit 506 causes the camera 30 to capture a preset number of frame images. As a result, from the camera 30, the set number of frame images are output. The plurality of output frame images are sent to the processing unit 500. A description is given herein on the assumption that the processing unit 500 has acquired M (M>2) frame images.

(2) Dark Image Subtraction Processing S20

Next, the image processing unit 502 performs the dark image subtraction processing S20 on each of the M acquired frame images. The dark image subtraction processing S20 is processing of subtracting the dark-time image from each of the frame images. By performing the dark image subtraction processing S20, it is possible to remove regular noise of the image sensor 32.

Figure 4:
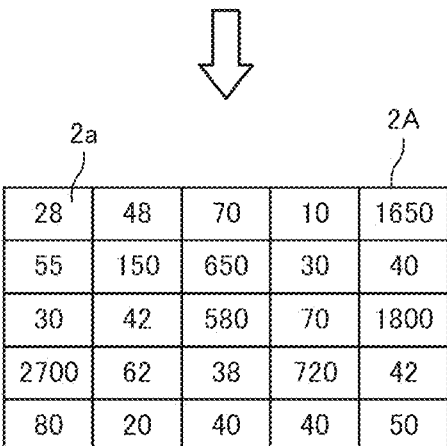
FIG. 4 is a diagram for illustrating dark image subtraction processing.

FIG. 4 is a diagram for illustrating the dark image subtraction processing S20.

As illustrated in FIG. 4, the image processing unit 502 subtracts the dark-time image 4 from each of the frame images 2. Specifically, the image processing unit 502 subtracts, from a pixel value of each of image pixels 2a of the frame image 2, a pixel value of a corresponding image pixel 4a of the dark-time image 4. This allows the regular noise of the image sensor 32 to be removed from the frame image 2. By the dark image subtraction processing S20, it is possible to obtain M frame images 2A resulting from the removal of the regular noise of the image sensor 32 from each of the M frame images 2. Note that, in the example illustrated in FIG. 4, each of the frame images 2 has 5×5 image pixels 2a, but the number of the pixels of the frame image 2 is not particularly limited. For example, the frame image 2 may also have the 4000×4000 image pixels 2a.

(3) Sensitivity Correction Processing S30

The image processing unit 502 performs the sensitivity correction processing S30 for correcting the sensitivities of the sensor pixels on each of the M frame images 2A after subjected to the dark image subtraction processing.

Figure 5:
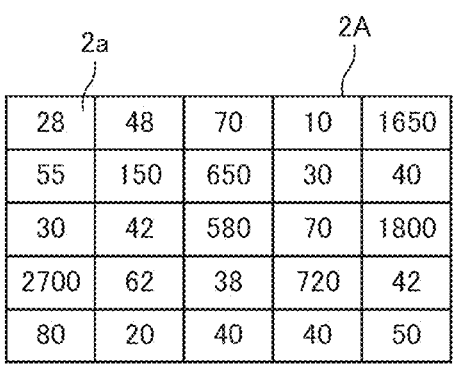
FIG. 5 is a diagram for illustrating sensitivity correction processing.

FIG. 5 is a diagram for illustrating the sensitivity correction processing S30.

The image processing unit 502 uses the correction coefficients to correct the respective pixel values of the individual image pixels 2a of the frame image 2A. In the memory unit 530, a sensitivity correction table 6 is stored. As illustrated in FIG. 5, the sensitivity correction table 6 is a table in which the correction coefficients each calculated for each of the sensor pixels are stored. In the sensitivity correction table 6, coordinates of each of the sensor pixels are registered in association with the correction coefficient for correcting the sensitivity of the sensor pixel. In the example illustrated in FIG. 5, the sensitivity correction table 6 has a plurality of cells 6a corresponding on a one-to-one basis to the plurality of sensor pixels included in the image sensor 32, and the correction coefficients are stored in the plurality of respective cells 6a.

The image processing unit 502 corrects the pixel values of the individual image pixels 2a of the frame image 2A by using the correction coefficients stored in the corresponding cells 6a. For example, the pixel value of each of the image pixels 2a of the frame image 2A is divided by the correction coefficient stored in the corresponding cell 6a. By the sensitivity correction processing S30, it is possible to obtain, from the M frame images 2A, M frame images 2B having the sensor pixels with the corrected sensitivities.

(4) Counting Processing S40

Next, the image processing unit 502 performs the counting processing S40 on each of the M frame images 2B having the sensor pixels with the corrected sensitivities. In the following, a description will be given first of a reason for performing the counting processing S40.

Figure 6:
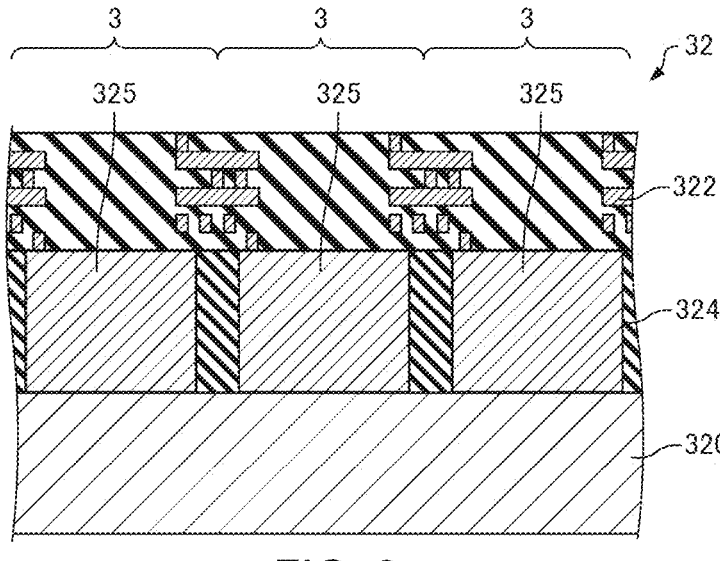
FIG. 6 is a cross-sectional view schematically illustrating an image sensor.

As described above, the camera 30 is the direct detection camera that uses the image sensor 32 to directly detect the electrons. FIG. 6 is a cross-sectional view schematically illustrating the image sensor 32.

As illustrated in FIG. 6, the image sensor 32 includes a supporting layer 320, a wiring layer 322, and a sensitive layer 324. The supporting layer 320 supports the wiring layer 322 and the sensitive layer 324. The wiring layer 322 is disposed on the sensitive layer 324. The wiring layer 322 includes metal layers stacked to be included in a plurality of wires, a plurality of vias, and the like. The wiring layer 322 also includes insulating layers stacked to provide insulation between the wires.

In the sensitive layer 324, a plurality of photodiodes 325 are formed. Between the photodiodes 325, insulation is provided by isolation portions each having a STI (shallow trench isolation) structure or a LOCOS (Local Oxidation of Silicon) structure. Each one of the photodiodes 325 is included in each one of the sensor pixels 3.

The sensitive layer 324 is a semiconductor layer having a thickness of, e.g., 50 μm. When the electrons are incident on the photodiodes 325, electron-hole pairs are generated by a photoelectric effect. The image sensor 32 converts the electrons (or holes) to a voltage and reads the voltage as an electronic signal. Each of the sensor pixels 3 is formed with an amplifier for amplifying a minute electric signal generated in the photodiode 325, though not illustrated. The electric signals generated in the photodiodes 325 are retrieved by the plurality of wires formed in the wiring layer 322. In the image sensor 32, the sensitive layer 324 is thinned to control interaction between the electron beam and the semiconductor layer and reduce the noise.

Figure 7:
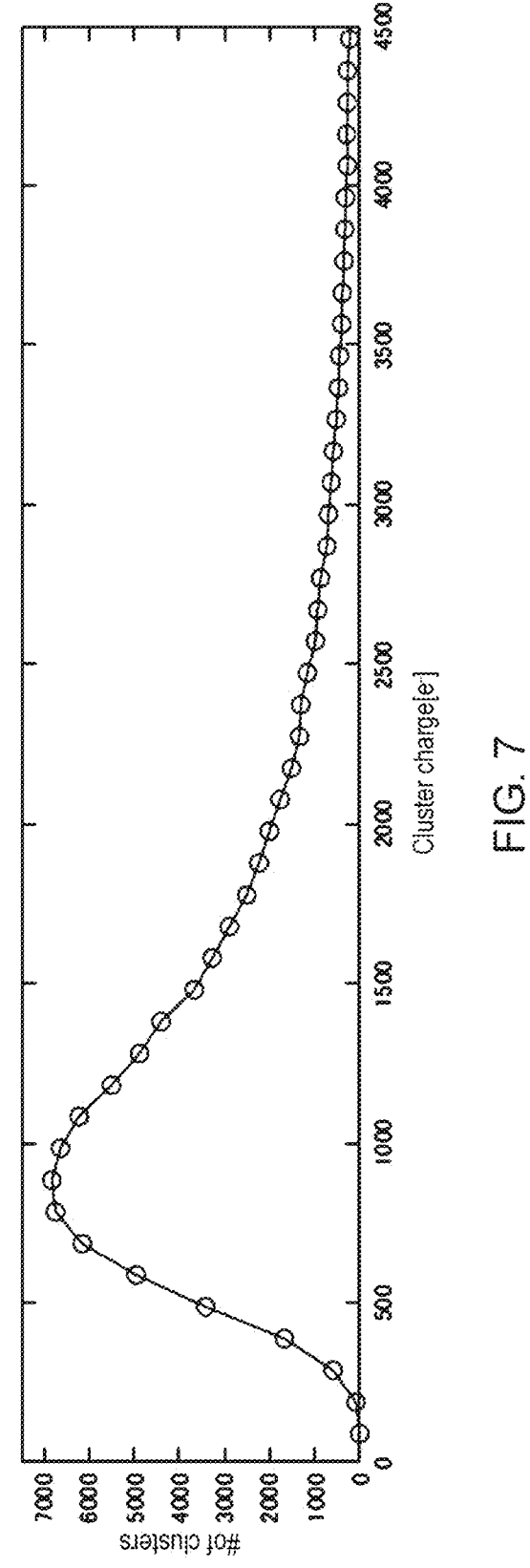
FIG. 7 is a graph representing an amount of signal generated when one electron is incident on any of sensor pixels of the image sensor.

FIG. 7 is a graph representing an amount of signal (an amount of charge) generated when one incident electron is incident on any of the sensor pixels 3 of the image sensor 32.

In the one sensor pixel 3, the amount of signal generated by the photoelectric effect has a Landau distribution, as illustrated inn FIG. 7. This is because, by thinning the sensitive layer 324, the incident electron passes through the sensitive layer 324 without completely losing energy thereof in the sensitive layer 324. For example, in a case where a material of the sensitive layer 324 is silicon, a thickness of the sensitive layer 324 is 50 μm or less, and a thickness of the wiring layer 322 is 10 μm or less, when the electron with an acceleration voltage of 100 kV or more is incident on the image sensor 32, the amount of signal generated by the photoelectric effect follows the Landau distribution. In other words, when the thickness of the sensitive layer 324 is 50 μm or less, the thickness of the wiring layer 322 is 10 μm or less, and the acceleration voltage is 100 kV or more, the output value of the sensor pixel 3 follows the Landau distribution.

In the image sensor 32 in which an output signal from each of the plurality of sensor pixels 3 follows the Landau distribution, even when the frame images 2 are simply integrated to generate an image, linearity between the pixel values of the individual image pixels 2a of the frame images 2 and the number of the incident electrons is insufficient.

Accordingly, to improve the linearity between the pixel values of the individual image pixels 2a of the frame images 2 and the number of the incident electrons, the image processing unit 502 performs the counting processing S40 on each of the M frame images 2B. In the counting processing S40, the incident electrons are counted by digitizing each of the frame images 2B.

Figure 8:
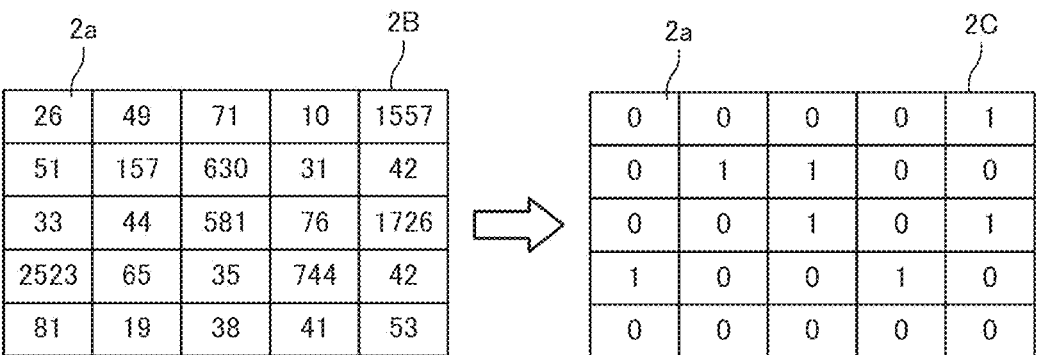
FIG. 8 is a diagram for illustrating counting processing.

FIG. 8 is a diagram for illustrating the counting processing S40. For example, in a case where a threshold is set to 140, when the pixel value of each of the image pixels 2a of the frame image 2B is larger than 140, the pixel value is set to "1" while, when the pixel value is equal to or less than 140, the pixel value is set to "0". Thus, a digitized frame image 2C can be obtained. The threshold is set herein to a value which is larger than noise and small to an extent that no noise is included. Thus, it is possible to reduce the possibility of counting noise as the incident electron or losing count of the incident electron.

In the frame image 2C, the image pixel 2a corresponding to the sensor pixel 3 on which the electron is incident is represented by "1", while the image pixel 2a corresponding to the sensor pixel 3 on which no electron is incident is represented by "0". By thus performing the counting processing S40, it is possible to know the number of the electrons incident on the image sensor 32 per frame and positions of the sensor pixels 3 on which the electrons are incident.

(5) Integration Processing S50

The image processing unit 502 performs integration of the M digitized frame images 2C to generate the TEM image. The image processing unit 502 performs integration of the pixel values of the corresponding image pixels 2a of the M frame images 2C.

By the foregoing processing, it is possible to generate, from the plurality of images 2, the TEM image with high linearity between the pixel values and the number of the incident electrons. The image processing unit 502 causes the display unit 520 to display the generated TEM image, and ends the image generation processing.

3. IMAGE SENSOR SENSITIVITY CORRECTION

3.1. Sensor Pixel Sensitivity

In the image sensor 32, each of the sensor pixels 3 has a different sensitivity. The image sensor 32 has the amplifier for each of the sensor pixels 3 and, as one of factors which cause different sensitivities, variation in amplifier characteristics due to a manufacturing error or the like can be listed.

When each one of the sensor pixels 3 thus has a different sensitivity, in the Landau distribution presented by the output signal from each of the sensor pixels 3, a relative difference is produced between the sensor pixels 3. The relative sensitivity difference affects the counting processing S40.

For example, when the sensitivity of the target sensor pixel 3 is lower than an average of the sensitivities of all the sensor pixels 3 included in the image sensor 32, an amount of signal obtained from the incident electron in the target sensor pixel 3 relatively decreases. As a result, it may be possible that, even when the electron is incident on the target sensor pixel 3, the pixel value is determined to be not more than the threshold in the counting processing S40 and the electron is not counted as the incident electron to result in, i.e., count loss. Meanwhile, when the sensitivity of the target sensor pixel 3 is higher than the average of the sensitivities of all the sensor pixels 3 included in the image sensor 32, it may be possible that an amount of signal resulting from noise increases, and the incident electron is counted even though no electron is incident to result in, e.g., erroneous counting.

Therefore, by correcting the sensitivities of the plurality of sensor pixels 3 which are different from each other, it is possible to improve the accuracy of the counting processing S40.

As a calibration method for correcting the sensitivities, in a case of, e.g., a CMOS image sensor intended to detect visible light, there is a method in which, after the output value of each of the sensor pixels is obtained by using uniform illumination, a normalization coefficient is calculated for each of the sensor pixels such that the respective output values of the individual sensor pixels are uniform between the sensor pixels to obtain the correction coefficients. However, in the image sensor 32, the amount of signal obtained from the incident electron follows the Landau distribution, and consequently the correction coefficients cannot be calculated by this method.

3.2. Sensor Pixel Sensitivity Calibration Method

Figure 9:
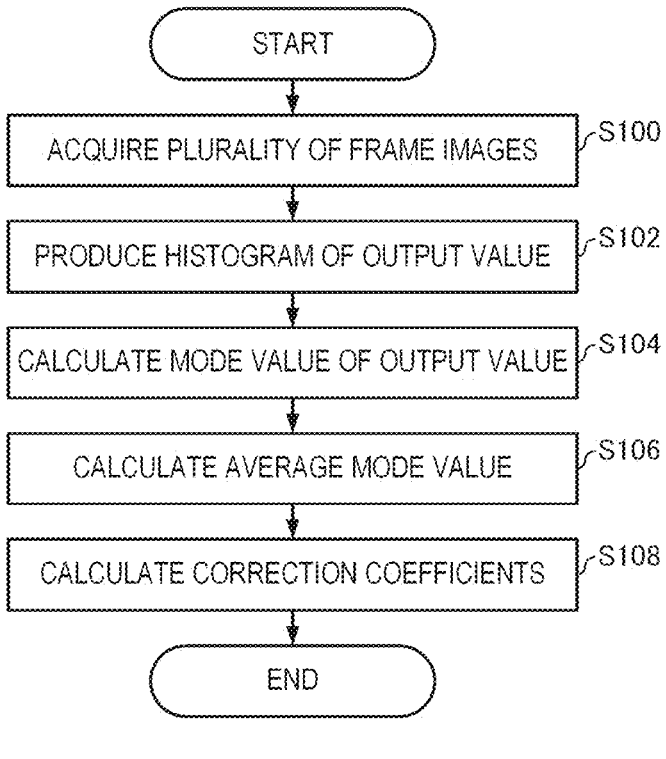
FIG. 9 is a flow chart illustrating an example of processing by a correction coefficient calculation unit.

FIG. 9 is a flow chart illustrating an example of processing by the correction coefficient calculation unit 504.

First, the correction coefficient calculation unit 504 acquires the plurality of frame images 2 captured under a condition that the electrons incident on the image sensor 32 follow a Poisson process (S100).

In the capturing of the frame images 2, the electron optical system 10 is adjusted first such that the electrons incident on the image sensor 32 follow the Poisson process. Specifically, the electron beam is emitted to a vacuum portion where the sample S is not present to adjust the electron optical system 10 so as to satisfy a parallel irradiation condition such that the electron beam uniformly irradiates the image sensor 32. In this state, the electron optical system 10 is adjusted such that the average of the numbers of the electrons incident on the individual sensor pixels 3 per frame coincides with a dispersion thereof. In addition, the average of the numbers of the electrons incident on the individual sensor pixels 3 per frame is set smaller than 1. Preferably, the average of the numbers of the electrons incident on the individual sensor pixels 3 per frame is 0.1 or less, i.e., 0.1 e-/pixel/frame or less. By adjusting the electron optical system 10, it is possible to adjust the number of the electrons incident on each of the sensor pixels 3 per frame. By irradiating the image sensor 32 with the electrons under such a condition, the Poisson process is established.

It is assumed herein that the electron incident on one of the sensor pixels 3 of the image sensor 32 does not enter the adjacent sensor pixel 3.

Then, the image sensor 32 is irradiated with the electrons under the condition that the electrons incident on the image sensor 32 follow the Poisson process to capture a preset number of the frame images 2 with the camera 30. For example, about several hundreds to several thousands of frame image 2 are captured. As the number of the frame images 2 is larger, statistical fluctuation can be reduced more. A description is given herein on the assumption that N (N>2) frame images 2 are acquired.

By the foregoing steps, the N frame images 2 can be captured. The N frame images 2 captured by the camera 30 are sent to the imaging processing device 50. Thus, the correction coefficient calculation unit 504 can acquire the N frame images 2.

The processing of capturing the N frame images 2 described above is automatically performed by the camera control unit 506 by controlling the electron optical system control unit 40 and the camera 30. It may also be possible that the user captures the N frame images 2 by operating the electron microscope 100.

While the description has been given of a case where, in the processing S100 of acquiring the N frame images 2 described above, the value of each of the image pixels 2a of the frame image 2 is the pixel value, but it may also be possible that the value of each of the image pixels 2a of the frame image 2 is a voltage value. In other words, the output value of each of the sensor pixels 3 may be either the pixel value or the voltage value.

Next, the correction coefficient calculation unit 504 acquires, from the acquired N frame images 2, information on the output value of each of the sensor pixels 3 to produce a histogram of the output value of each of the sensor pixels 3 (S102).

The correction coefficient calculation unit 504 extracts, from each of the N frame images 2, the pixel value of the image pixel 2a at the same coordinates. Thus, the N pixel values are obtained from the individual image pixels 2a at the same coordinates. The pixel value of each of the image pixels 2a has a value according to the output value of the corresponding sensor pixel 3. Accordingly, from the N frame image 2, the N output values from the individual sensor pixels 3 can be obtained. In other words, the N output values are sampled from the individual sensor pixels 3.

The correction coefficient calculation unit 504 produces the histogram for each of the sensor pixels 3 from information on the output value acquired for each of the sensor pixels 3.

Figures 10, 11:
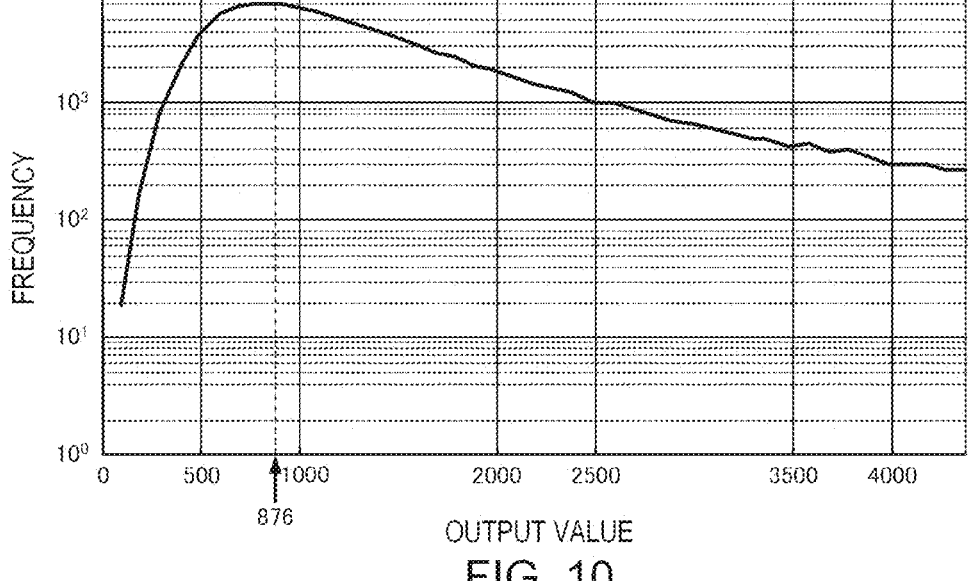
FIG. 10 is a histogram of an output value of any of the sensor pixels.
FIG. 11 is a diagram illustrating an example of a mode value table.

FIG. 10 is the histogram of the output value of any of the sensor pixels 3. In the histogram of the output value of the sensor pixel 3 illustrated in FIG. 10, an abscissa axis represents the output value of the sensor pixel 3, while an ordinate axis represents a frequency.

Then, the correction coefficient calculation unit 504 calculates a mode value of the output value from the histogram (S104). The mode value of the output value corresponds to a peak position of the histogram. The mode value calculated from the histogram of the output value of any of the sensor pixels 3 illustrated in FIG. 10 was 876. The correction coefficient calculation unit 504 determines the mode value for each of the sensor pixels 3 from the histogram produced for each of the sensor pixels 3.

The correction coefficient calculation unit 504 produces a mode value table 8 by associating the determined mode value with a position of the sensor pixel 3.

FIG. 11 is a diagram illustrating an example of the mode value table 8. The mode value table 8 has a plurality of cells 8a corresponding to the plurality of sensor pixels 3. The mode value determined for each of the sensor pixels 3 is stored in the cell 8a at the coordinates corresponding to the sensor pixel 3 from which the mode value is obtained.

Then, the correction coefficient calculation unit 504 averages the mode values determined for the individual sensor pixels 3 to calculate an average mode value (S106).

The correction coefficient calculation unit 504 divides a sum of all the mode values stored in the mode value table 8 by the number of the sensor pixels 3 (cells 8a) to determine the average mode value. The average mode value calculated from the mode value table 8 illustrated in FIG. 11 was 873.76.

Then, the correction coefficient calculation unit 504 divides each of the mode values determined for the individual sensor pixels 3 by the average mode value to determine the plurality of correction coefficients (S108).

The mode value stored in each of the cells 8a of the mode value table 8 is divided by the average mode value. Thus, the sensitivity correction table 6 illustrated in FIG. 5 can be produced. The sensitivity correction table 6 has the plurality of cells 6a corresponding on a one-to-one basis to the plurality of sensor pixels 3 included in the image sensor 32. In each of the cells 6a, the correction coefficient for correcting the output value output from the corresponding sensor pixel 3 is stored.

After producing the sensitivity correction table 6, the correction coefficient calculation unit 504 ends the processing. As described above, in the sensitivity correction processing S30 illustrated in FIG. 3, the sensitivity of each of the sensor pixels 3 is corrected by using the sensitivity correction table 6. Thus, it is possible to calibrate the sensitivity of each of the sensor pixels 3.

4. ACQUISITION OF DARK-TIME IMAGE

4.1. Dark-Time Image

In the dark image subtraction processing S20, the dark-time image 4 is used. The dark-time image 4 is the image captured in the state where the electron beam is not incident on the camera 30. The output value of each of the sensor pixels 3 is offset herein. For example, when the offset is 60, the output value of the sensor pixel 3 in the state where the electron beam is not incident on the camera 30 is 60. In the camera 30, the image sensor 32 directly detects the electrons, and consequently the image sensor 32 is damaged by the electron beam. When noise is increased due to the damage, the output value of the image sensor 32 is accordingly increased by the increase of the noise. For example, when the offset is 60 and the output value increased by the noise is 50, the output value of the sensor pixel 3 in the state where the electron beam is not incident on the camera 30 is 110.

Thus, the output value of the sensor pixel 3 varies due to the electron beam damage, and therefore the dark-time image 4 used in the dark image subtraction processing S20 is preferably updated. In the electron microscope 100, the dark-time image 4 can automatically be updated.

Specifically, in the electron microscope 100, the camera control unit 506 acquires the control information for the electron optical system 10 from the electron optical system control unit 40 and controls the camera 30 based on the acquired control information to acquire the dark-time image 4. The camera control unit 506 determines, based on the control information for the electron optical system 10, whether or not the electron is incident on the camera 30 and controls the camera 30 to acquire the dark-time image 4 when having determined that no electron is incident on the camera 30.

When the damage caused by the electron beam to the image sensor 32 proceeds to increase the noise, accuracy of the counting processing S40 deteriorates. Accordingly, in the electron microscope 100, the camera control unit 506 determines a degree of the damage to the image sensor 32 based on the dark-time image 4 and notifies the user to replace the image sensor 32 depending on a result of the determination.

4.2. Dark-Time Image Update Processing

Figure 12:
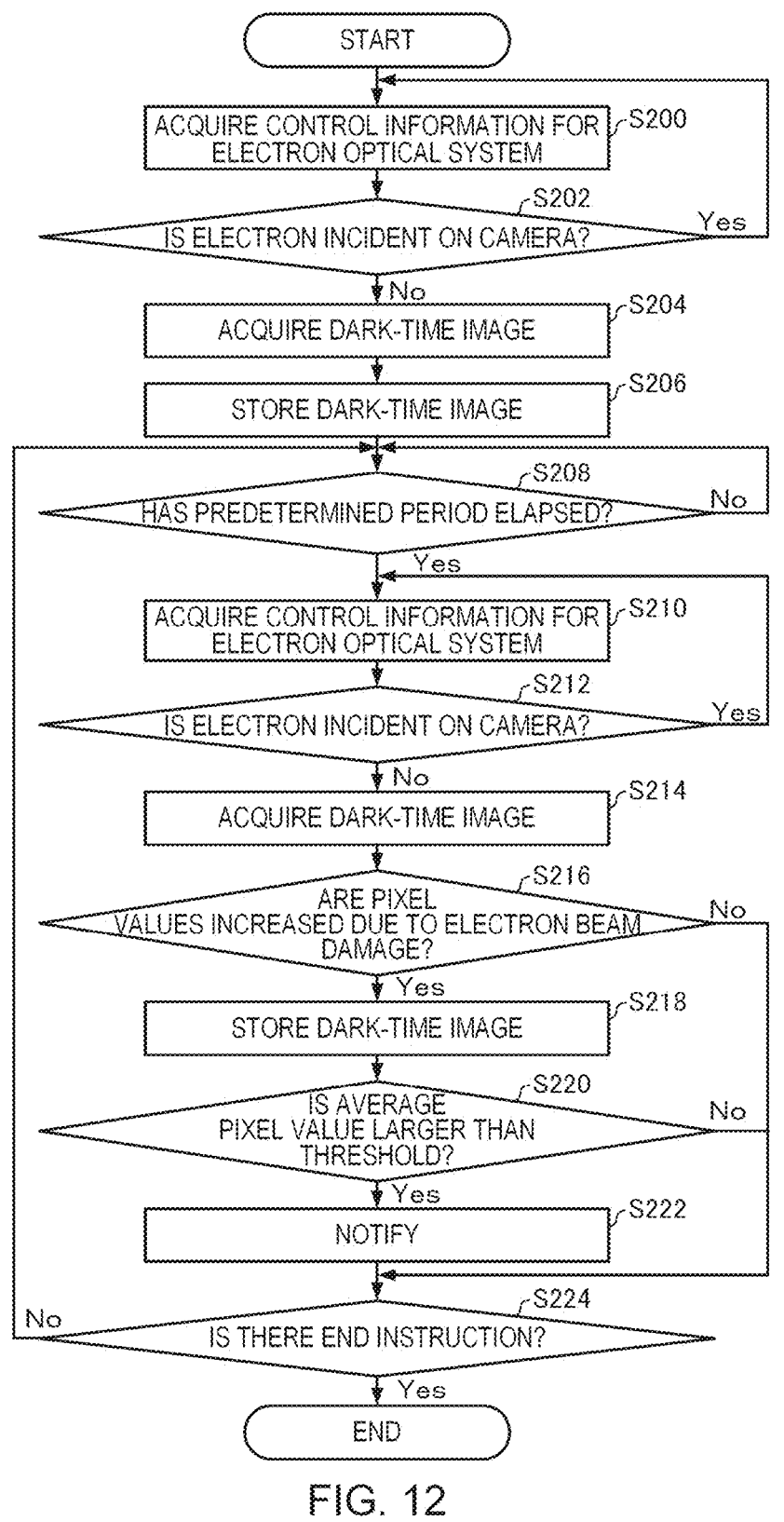
FIG. 12 is a flow chart illustrating an example of dark-time image update processing by a camera control unit.

FIG. 12 is a flow chart illustrating an example of dark-time image update processing by the camera control unit 506.

First, the camera control unit 506 acquires the control information for the electron optical system 10 from the electron optical system control unit 40 (S200). The control information for the electron optical system 10 includes information on states of individual portions included in the electron optical system 10. The electron optical system control unit 40 and the imaging processing device 50 are communicatively connected via, e.g., a serial cable or the like. For example, the electron optical system control unit 40 sends the control information for the electron optical system 10 to the imaging processing device 50 in response to a request from the camera control unit 506.

The camera control unit 506 determines, based on the control information for the electron optical system 10, whether or not the electron is incident on the camera 30 (S202). For example, when a state where the electron beam is not emitted from the electron source 12, a state where the fluorescent screen 18 is closed, or a state where a blanking device of the electron source 12 not shown is blocking the electron beam is reached, the camera control unit 506 determines that no electron is incident on the camera 30. Such a state can be recognized from the control information for the electron optical system 10.

The camera control unit 506, when having determined that the electron is incident on the camera 30 (Yes in S202), returns to the processing S200 to acquires the control information for the electron optical system 10 (S200). The camera control unit 506 repeats the processing S200 of acquiring the control information for the electron optical system 10 and the determination processing S202 until determining that no electron is incident on the camera 30.

The camera control unit 506, when having determined that no electron is incident on the camera 30 (No in S202), controls the camera 30 to acquire the dark-time image 4 (S204). In a state where no electron is incident on the camera 30, the camera control unit 506 causes the camera 30 to capture the frame images 2. Thus, the dark-time image 4 can be acquired. The dark-time image 4 may be the single frame image 2 captured in the state where no electron is incident on the camera 30 or may also be an image obtained by averaging the plurality of frame images 2 captured in the state where no electron is incident on the camera 30.

The camera control unit 506 causes the memory unit 530 to store the acquired dark-time image 4 as the dark-time image 4 for the dark image subtraction processing S20 (S206).

The camera control unit 506 determines whether or not a predetermined period has elapsed from the acquisition of the dark-time image 4 (S208). The predetermined period mentioned herein is a period from the acquisition of the dark-time image 4 to subsequent acquisition of the dark-time image 4. The predetermined period is set in advance. The predetermined period may be, e.g., 24 hours or 168 hours. It may also be possible for the user to optionally set the predetermined period. The camera control unit 506 stands by until the predetermined period elapses from the acquisition of the dark-time image 4 in the processing S204 (No in S208).

The camera control unit 506, when having determined that the predetermined time has elapsed (Yes in S208), acquires the control information for the electron optical system 10 from the electron optical system control unit 40 (S210). Then, based on the control information for the electron optical system 10, the camera control unit 506 determines whether or not the electron is incident on the camera 30 (S212).

The camera control unit 506, when having determined that the electron is incident on the camera 30 (Yes in S212), returns to the processing S210 to acquire the control information for the electron optical system 10 (S210). The camera control unit 506 repeats the processing S210 of acquiring the control information for the electron optical system 10 and the determination processing S212 until determining that no electron is incident on the camera 30.

The camera control unit 506, when having determined that no electron is incident on the camera 30 (No in S212), controls the camera 30 to acquire the dark-time image 4 (S214).

The processing S210 of acquiring the control information for the electron optical system 10, the processing S212 of determining whether or not the electron is incident, and the processing S214 of acquiring the dark-time image 4 are performed similarly to the processing S200, the processing S202, and the processing S204. Note that, hereinafter, the dark-time image 4 newly acquired in the processing S214 is referred to as a new dark-time image 4A, while the dark-time image 4 stored as the dark-time image 4 for the dark image subtraction processing S20 in the memory unit 530 is referred to as an existing dark-time image 4B.

Then, the camera control unit 506 compares the new dark-time image 4A to the existing dark-time image 4B to determine whether or not the pixel values of the plurality of image pixels 4a of the new dark-time image 4A are increased due to the electron beam damage (S216).

For example, the camera control unit 506 compares an average value of the pixel values (average pixel value) of the plurality of image pixels 4a of the new dark-time image 4A to an average value of the pixel values (average pixel value) of the plurality of image pixels 4a of the existing dark-time image 4B. When the average pixel value of the new dark-time image 4A is larger than the average pixel value of the existing dark-time image 4B, the camera control unit 506 determines that the pixel values are increased due to the electron beam damage.

The camera control unit 506, when having determined that the pixel values are increased due to the electron beam damage (Yes in S216), causes the memory unit 530 to store the new dark-time image 4A as the dark-time image 4 for the dark image subtraction processing S20 (S222). At this time, the existing dark-time image 4B stored in the memory unit 530 is deleted. Thus, the dark-time image 4 for the dark image subtraction processing S20 is updated.

Then, the camera control unit 506 determines whether or not the average pixel value of the dark-time image 4 stored in the memory unit 530 is larger than the threshold (S220). The threshold may be set in advance or may also be settable by the user to any value.

The camera control unit 506, when having determined that the average pixel value of the dark-time image 4 is larger than the threshold (Yes in S220), notifies the user to replace the image sensor 32 (S222).

The camera control unit 506 displays, e.g., a message prompting the replacement of the image sensor 32 on the display unit 520. Note that a notification method is not limited to the message notification, and the notification may also be made using sound, vibration, light, or the like.

When the camera control unit 506 determines that the pixel value is not increased due to the electron beam damage (No in S216), when the camera control unit 506 determines that the average pixel value of the dark-time image 4 is not larger than the threshold (No in S220), and after the notification processing S222, the camera control unit 506 determines whether or not the user has given an instruction to end the dark-time image update processing (S224). For example, when the user has input the instruction to end the dark-time image update processing via the operation unit 510, the camera control unit 506 determines that the user has given the end instruction.

The camera control unit 506, when having determined that the user has not given the end instruction (No in S224), returns to the processing S208 to determine whether or not the predetermined period has elapsed from the acquisition of the dark-time image 4 (S208). The camera control unit 506 stands by until the predetermined period elapses from the acquisition of the dark-time image 4 in the processing S214 (No in S208).

Thus, the camera control unit 506 repeats the processing S208, the processing S210, the processing S212, the processing in S214, the processing S216, the processing S218, the processing S220, the processing S222, and the processing S224 until it is determined that the user has given the end instruction.

The camera control unit 506, when having determined that the user has given the end instruction (Yes in S224), ends the dark image update processing.

5. EFFECTS

The electron microscope 100 includes the electron optical system 10 that irradiates the sample S with electrons to form an image with the electrons transmitted through the sample S, the camera 30 that includes the image sensor 32 having the plurality of sensor pixels 3 and captures the frame images 2 that are based on the output values output from each of the plurality of sensor pixels 3 by incidence of the electrons on the image sensor 32, and the correction coefficient calculation unit 504 that calculates the plurality of correction coefficients for correcting the sensitivities of the plurality of sensor pixels 3. The correction coefficient calculation unit 504 also determines, from the plurality of frame images 2 captured under the condition under which the electrons incident on the image sensor 32 follow the Poisson process, the mode value of the output values for each of the sensor pixels 3 and calculates the plurality of correction coefficients based on the mode value determined for each of the sensor pixels 3.

Accordingly, in the electron microscope 100, it is possible to correct the sensitivities of the plurality of sensor pixels 3 which are different from each other. Thus, the accuracy of the counting processing S40 can be improved.

In the electron microscope 100, the correction coefficient calculation unit 504 averages the mode values determined for the sensor pixels 3 to calculate the average mode value and divides the mode value by the average mode value for each of the sensor pixels 3 to calculate the plurality of correction coefficients. Therefore, in the electron microscope 100, even when the image sensor 32 is such that the output value output from each of the plurality of sensor pixels 3 by the incidence of the electrons on the image sensor 32 follows the Landau distribution, it is possible to calculate the plurality of correction coefficients for correcting the sensitivities of the plurality of sensor pixels 3 which are different from each other.

In the electron microscope 100, the camera 30 is the direct detection camera that directly detects the electrons with the image sensor 32. Accordingly, in the electron microscope 100, the high-definition TEM image can be acquired.

The electron microscope 100 includes the electron optical system control unit 40 that controls the electron optical system 10 and the camera control unit 506 that controls the camera 30, and the camera control unit 506 acquires the control information for the electron optical system 10 from the electron optical system control unit 40 and controls the camera 30 based on the acquired control information to acquire the dark-time image 4. Accordingly, in the electron microscope 100, the dark-time image 4 can automatically be acquired.

In the electron microscope 100, the camera control unit 506 determines, based on the control information for the electron optical system 10, whether or not the electron is incident on the camera 30 and controls the camera 30 to acquire the dark-time image 4 when having determined that no electron is incident on the camera 30. Accordingly, in the electron microscope 100, the dark-time image 4 can automatically be acquired.

A calibration method for the image sensor 32 in the electron microscope 100 includes the step of determining, from the plurality of frame images 2 captured under the condition that the electrons incident on the image sensor 32 follow the Poisson process, the mode value of the output value of each of the sensor pixels 3 and the step of calculating, based on the mode value determined for each of the sensor pixels 3, the plurality of correction coefficients for correcting the sensitivities of the plurality of sensor pixels 3. Accordingly, it is possible to correct the sensitivities of the plurality of sensor pixels 3 which are different from each other. Therefore, the accuracy of the counting processing S40 can be improved.

6. MODIFICATIONS

6.1. First Modification

In the embodiment described above, the description has been given on the assumption that the electron incident on one of the sensor pixels 3 of the image sensor 32 does not enter the adjacent sensor pixel 3, but there is a case where the electron incident on the one sensor pixel 3 enters another adjacent sensor pixel 3. In this case, for example, in the processing $100 of acquiring the frame images 2 illustrated in FIG. 9, the number of the frame images 2 to be acquired is increased to increase the number of the sampled outputs values. This can reduce an effect of the electron that has been incident on the one sensor pixel 3 and then entered the other adjacent sensor pixel 3.

6.2. Second Modification

In the embodiment described above, the description has been given on the assumption that the electron incident on one of the sensor pixels 3 of the image sensor 32 does not enter the adjacent sensor pixel 3, but there is a case where the electron incident on the one sensor pixel 3 enters another adjacent sensor pixel 3.

In this case, the number of the electrons incident on the image sensor 32 does not coincide with the number of the electrons specified in the frame images 2. Accordingly, processing for causing the number of the electrons incident on the image sensor 32 to coincide with the number of the electrons specified in the frame images 2 is performed. For example, the one image pixel 2a of concern and the plurality of image pixels 2a adjacent to the one image pixel 2a are assigned to one group, a position of the center of gravity is determined from the pixel values of the individual image pixels 2a, and the image pixel 2a overlapping the position of the center of gravity is assumed to be the image pixel 2a corresponding to the sensor pixel 3 on which the electron is incident. The sensor pixel 3 on which the electron is incident may also be specified by using a grouping method of thus assigning the plurality of image pixels 2a to the one group.

6.3. Third Modification

Figure 13:
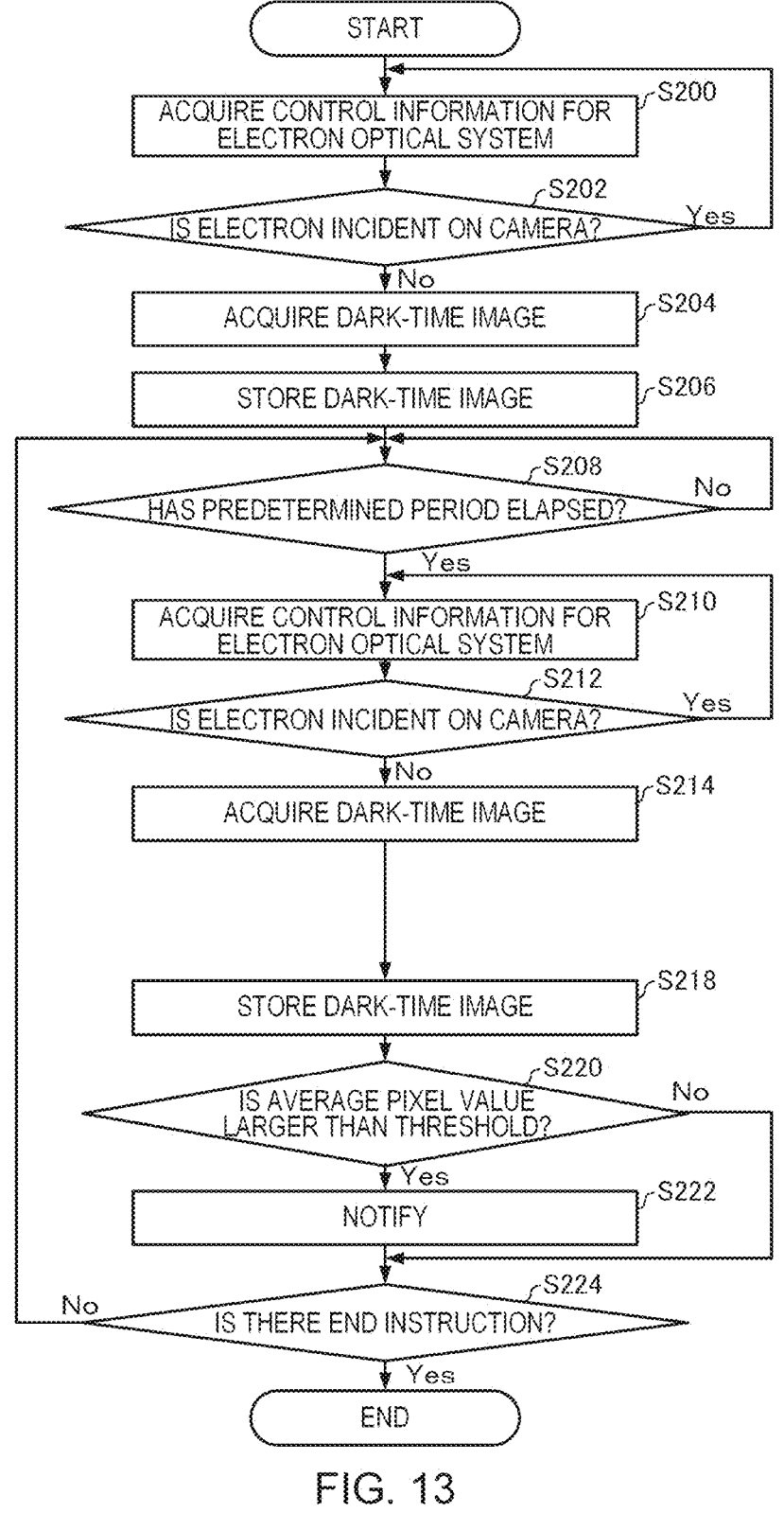
FIG. 13 is a flow chart illustrating a modification of the dark-time image update processing by the camera control unit.

FIG. 13 is a flow chart illustrating a modification of the dark-time image update processing by the camera control unit 506.

In the dark-time image update processing illustrated in FIG. 12 described above, the camera control unit 506 compares the new dark-time image 4A to the existing dark-time image 4B to determine whether or not the pixel values of the plurality of image pixels 4a of the new dark-time image 4A are increased due to the electron beam damage (S216). In other words, in the dark-time image update processing illustrated in FIG. 12, when the pixel values are increased due to the electron beam damage, the dark-time image 4 is updated.

By contrast, as illustrated in FIG. 13, the determination processing S216 need not be performed. In other words, after the new dark-time image 4A is acquired in the processing S214, the new dark-time image 4A is constantly stored as the dark-time image 4 for the dark image subtraction processing S20 in the memory unit 530, and the existing dark-time image 4B is deleted from the memory unit 530. Thus, in the dark-image update processing, the newest dark-time image 4 may also be constantly used as the dark-time image 4 for the dark image subtraction processing S20.

6.4. Fourth Modification

Figure 14:
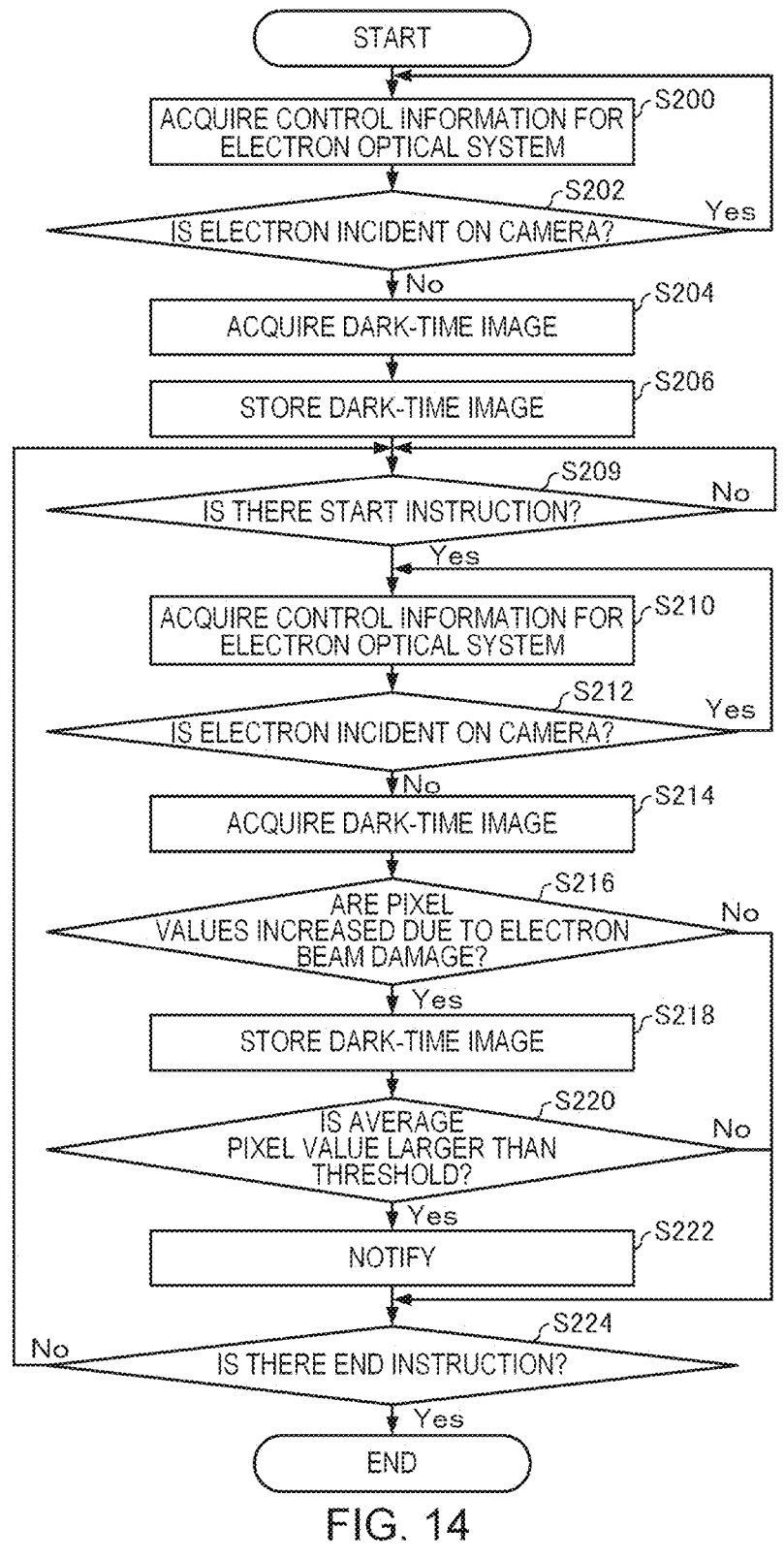
FIG. 14 is a flow chart illustrating a modification of the dark-time image update processing by the camera control unit.

FIG. 14 is a flow chart illustrating a modification of the dark-time image update processing by the camera control unit 506.

In the dark-time image update processing illustrated in FIG. 12 described above, the camera control unit 506 performs the processing S208 of determining whether or not the predetermined period has elapsed from the acquisition of the dark-time image 4. In other words, in the dark-time image update processing illustrated in FIG. 12, when it is determined that the predetermined period has elapsed (Yes in S208) and when it is determined that no electron is incident on the camera 30 (No in S212), the dark-time image 4 is acquired (S214).

By contrast, in the dark-time image update processing illustrated in FIG. 14, the camera control unit 506 performs processing S209 of determining whether or not the user has given an instruction to start acquiring the dark-time image 4. In other words, in the dark-time image update processing illustrated in FIG. 13, when it is determined that the user has given the instruction to start acquiring the dark-time image 4 (Yes in S209) and when it is determined that no electron is incident on the camera 30 (No in S212), the dark-time image 4 is acquired (S214).

The camera control unit 506 determines that the user has given the instruction to start acquiring the dark-time image 4 when, e.g., the user inputs the instruction to start acquiring the dark-time image 4 via the operation unit 510.

Note that the embodiment and modifications described above are examples, and the present invention is not limited thereto. For example, the embodiment and the individual modifications can appropriately be combined with each other.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

What is claimed is:

1. An electron microscope comprising:
an electron optical system that irradiates a sample with an electron beam to form an image with electrons transmitted through the sample;
a camera that comprises an image sensor having sensor pixels and captures frame images that are based on output values output from each of the sensor pixels by incidence of the electrons on the image sensor; and
a correction coefficient calculation unit that calculates correction coefficients for correcting sensitivities of the sensor pixels,
the correction coefficient calculation unit configured to:
determine, from the frame images captured under a condition under which the electrons incident on the image sensor follow a Poisson process, a mode value of the output values for each of the sensor pixels; and
calculate the correction coefficients based on the mode value determined for each of the sensor pixels,
wherein the condition under which the frame images are captured is established by emitting the electron beam to a vacuum portion where the sample is not present to adjust the electron optical system such that an average of a number of the electrons incident on each of the sensor pixels per frame coincides with a dispersion thereof, thereby establishing the Poisson process.

2. The electron microscope according to claim 1, wherein the correction coefficient calculation unit is further configured to:
average the mode values determined for the sensor pixels to calculate an average mode value, and
divide the mode value by the average mode value for each of the sensor pixels to calculate the correction coefficients.

3. The electron microscope according to claim 1, wherein the image sensor is a sensor in which the output values output from each of the sensor pixels by the incidence of the electrons on the image sensor follow a Landau distribution.

4. The electron microscope according to claim 3, wherein the camera is a direct detection camera that directly detects the electrons with the image sensor.

5. The electron microscope according to claim 1, further comprising:
an electron optical system control unit that controls the electron optical system; and
a camera control unit that controls the camera, wherein the camera control unit is configured to acquire control information for the electron optical system from the electron optical system control unit, and the camera control unit is configured to control the camera based on the acquired control information to acquire a dark-time image.

6. The electron microscope according to claim 5, wherein the camera control unit is further configured to:

determine, based on the control information, whether the electrons are incident on the camera; and control the camera to acquire the dark-time image when having determined that no electron is incident on the camera.

7. A calibration method for an image sensor in an electron microscope comprising an electron optical system that irradiates a sample with an electron beam to form an image with electrons transmitted through the sample, and a camera that comprises the image sensor having sensor pixels and captures frame images that are based on output values output from each of the sensor pixels by incidence of the electrons on the image sensor, the calibration method comprising:

determining, from the frame images captured under a condition under which the electrons incident on the image sensor follow a Poisson process, a mode value of the output values for each of the sensor pixels; and calculating correction coefficients for correcting sensitivities of the sensor pixels based on the mode value determined for the sensor pixels, wherein the condition under which the frame images are captured is established by emitting the electron beam to a vacuum portion where the sample is not present to adjust the electron optical system such that an average of a number of the electrons incident on each of the sensor pixels per frame coincides with a dispersion thereof, thereby establishing the Poisson process.

* * * * *